United States Patent
Murray

(10) Patent No.: US 8,011,424 B2
(45) Date of Patent: Sep. 6, 2011

(54) SYSTEM AND METHOD FOR CONVECTIVE HEAT TRANSFER UTILIZING A PARTICULATE SOLUTION IN A TIME VARYING FIELD

(75) Inventor: Mark M Murray, Annapolis, MD (US)

(73) Assignee: The United States of America, as represented by the Secretary of the Navy, Washington, DC (US)

(*) Notice: Subject to any disclaimer, the term of this patent is extended or adjusted under 35 U.S.C. 154(b) by 1236 days.

(21) Appl. No.: 11/423,310

(22) Filed: Jun. 9, 2006

(65) Prior Publication Data

US 2007/0039721 A1 Feb. 22, 2007

Related U.S. Application Data

(60) Provisional application No. 60/690,056, filed on Jun. 9, 2005.

(51) Int. Cl.
*F28F 27/00* (2006.01)
*F28D 13/00* (2006.01)
(52) U.S. Cl. .................. 165/276; 165/104.16
(58) Field of Classification Search ............ 165/104.16, 165/276; 241/1; 366/273
See application file for complete search history.

(56) References Cited

U.S. PATENT DOCUMENTS

| | | | | |
|---|---|---|---|---|
| 3,848,363 A | * | 11/1974 | Lovness et al. | 241/1 |
| 4,543,733 A | * | 10/1985 | Siegell et al. | 165/104.16 |
| 4,546,552 A | * | 10/1985 | Cahn et al. | 165/104.16 |
| 4,720,025 A | * | 1/1988 | Tatevosian et al. | 366/273 |
| 7,344,301 B2 | * | 3/2008 | Garcia et al. | 366/273 |
| 7,658,340 B2 | * | 2/2010 | Pfeffer et al. | 241/1 |

OTHER PUBLICATIONS

Eastman, J. A., Choi, S. U. S., Yu, W., and Thompson, L. J., "Anomalously Increased Effective Thermal Conductivities of Ethylene Glycol Based Nanofluids Containing Copper Nanoparticles," Appl. Phys. Lett., vol. 78, No. 6, pp. 720, (Feb. 2001).

Eastman, J. A., Phillpot, S. R., Choi, S. U. S., and Keblinski, P., "Thermal Transport in Nanofluids," Annu. Rev. Mater. Res., vol. 34, pp. 219-246, (Mar. 2004).

Ganguly, R., Sen, S., and Puri, I. K., "Heat Transfer Augmentation Using a Magnetic Fluid Under the Influence of a Line Dipole," J. Magn. Magn. Mater., vol. 271, pp. 63-73, (2004), available online Oct. 2, 2003.

(Continued)

*Primary Examiner* — Ljiljana Ciric
(74) *Attorney, Agent, or Firm* — Amy L. Ressing; Sally A. Ferrett

(57) ABSTRACT

A convective heat transfer system for use with a fluid with particles, including a fluid channel having a wall and being capable of transferring the fluid, and a field emitter operable to emit a time-varying field into the fluid channel such that, when the fluid is in the channel, the time varying field affects a portion of the particles to change the rate of heat transfer between the channel and the fluid. The fluid can be a slurry with suspended field reactive particles. The system can include a plurality of field emitters located along the walls of the fluid channel, to vary the field and manipulate the distribution of the particles within the slurry, thereby changing the heat transfer characteristics of the system. The field can be an electric field or a magnetic field. The fluid channel can be disposed in a heat transfer system.

12 Claims, 5 Drawing Sheets

OTHER PUBLICATIONS

Hishida, K., and Maeda, M., "Enhancement and Control of Local Heat Transfer Coefficients in a Gas Flow Containing Soft Magnetic Particles," Exp. Heat Transfer, vol. 7, pp. 55-69, 1994.

Li, L. J. et al., "Heat Transfer Augmentation in 3D Internally Finned and Microfinned Helical Tube," Int. J. Heat Mass Transfer, vol. 48, No. 10, pp. 1916-1925, (Feb. 2005).

Liao, Q., and Xin, M. D., "Experimental Investigation on Forced Convective Heat Transfer and Pressure Drop of Ethylene Glycol in Tubes With Three-Dimensional Internally Extended Surface," Exp. Therm. Fluid Sci., vol. 11, No. 4, pp. 343-347, (1995).

Tangthieng, C., Finlayson, B. A., Maulbetsch, J., and Cader, T. "Heat Transfer Enhancement in Ferrofluids Subjected to Steady Magnetic Fields," J. Magn. Magn. Mater., vol. 201, pp. 252-255, (1999).

Xuan, Y., and Li, Q., "Investigation on Convective Heat Transfer and Flow Features of Nanofluids," J. Heat Transfer, vol. 125, pp. 151-155, (Feb. 2003).

Murray, Mark M., "Demonstrations of Heat Transfer Enhancement Using Ferromagnetic Particle Laden Fluid and Switched Magnetic Fields", Journal of Heat Transfer, vol. 130, pp. 114508-1-114508-4, Nov. 2008.

* cited by examiner

SYSTEM AND METHOD FOR CONVECTIVE HEAT TRANSFER UTILIZING A PARTICULATE SOLUTION IN A TIME VARYING FIELD

BACKGROUND

Heat transfer limitations and optimization have been an engineering design constraint for decades. Thermal management has been a key consideration in the design and development of military hardware in the past century. More recently, cooling effectiveness has become a very important technical challenge and is one of the limiting factors in the further development of a range of military related disciplines including electronic, high-energy weapon and propulsion systems. Microelectronic components are particularly susceptible to thermal management problems and have become an integral component in most military systems. Many of these components cannot operate at elevated temperatures resulting in a thermal management system becoming a key consideration.

Convective heat transfer is one way of addressing thermal management. Convective heat transfer is the heat transfer process that is executed by the flow of a fluid over a surface of a medium. Convective heat transfer includes advective heat transfer, which is based on the velocity of the fluid flow compared to the medium, and conductive heat transfer, which is based on static fluid adjacent to the medium. In convective heat transfer, the fluid acts as a carrier for the energy that it draws from (or delivers to) the surface of the medium.

FIG. 8 illustrates a convective heat transfer system wherein a fluid 804 flows with a velocity f adjacent to a medium 802. When fluid 804 passes adjacent to medium 802, the portion of fluid 804 that is directly adjacent to medium 802, i.e., at the boundary of medium 802, has a velocity of zero as a result of a sheer stress created at medium 802. The velocity of fluid 804 increases to a maximum as the distance from the boundary of medium 802 increases. A layer of fluid 804 adjacent to the boundary of medium 802, referred to as the boundary layer 806, is the layer fluid having a velocity much lower than the average velocity of the remainder, or bulk, of the flowing fluid. As illustrated in FIG. 8, flowing fluid 804 creates a boundary layer 806 adjacent to the boundary of medium 802 such that only a bulk of fluid 804, or bulk fluid 808, essentially flows.

For purposes of a simplistic explanation of heat transfer in the system of FIG. 8, assume that medium 802 has a temperature $H_m$, whereas bulk fluid 808 has an average temperature $H_f$, wherein $H_m \neq H_f$. The term "average" is used to describe the temperature $H_f$ of bulk fluid 808 because bulk fluid 808 will have many different local fluid temperatures, but the overall temperature of bulk fluid 808 can be generally described using the average of such temperatures. If $H_m < H_f$, then heat will be convectively transferred from bulk fluid 808 to medium 802 through boundary layer 806. Alternatively, if $H_m > H_f$, then heat will be convectively transferred from medium 802 to bulk fluid 808 through boundary layer 806.

There are many ways to specify the types of convection. The flow over the surface can be specified as internal, e.g., with pipes or ducts, or external, e.g., with fins. The motive force behind the bulk fluid motion can be forced, e.g., by a fan or pump, or natural, e.g., driven by buoyancy forces caused by fluid density changes with temperature. The flow can be further classified as single-phase, wherein the fluid does not change phase or multi-phase, e.g., boiling or condensation.

There are many specific characteristics of the flow of a fluid that greatly affect the heat transfer rate from/to the medium's surface, but the two categories that govern the effectiveness of single-phase forced convective heat transfer are: 1) the rate of conduction of energy (heat) to/from the medium surface; and 2) the rate of conveyance of energy toward/away from the surface with the mass flow of the bulk fluid. The rate of conduction is dictated by both the thermal conductivity of the fluid and the temperature of the fluid in the boundary layer. The thermal conductivity of the fluid is a temperature dependent physical property of the fluid that is being used in the convection process. The temperature of the fluid in the boundary layer is influenced by the amount of heat transferred, the specific heat of the fluid and the flow characteristics in the boundary layer. Poor flow characteristics will not allow the fluid in the boundary layer to be replaced by the bulk fluid. The major factors that determine the rate of energy conveyance are the mass flow rate of the bulk fluid and the specific heat capacity of the fluid.

The best convective heat transfer occurs when the fluid properties and flow conditions are optimized. The optimal fluid properties are high thermal conductivity and high specific heat capacity. The flow conditions that favor optimal convective heat transfer include high local fluid velocity at the medium's surface. Unfortunately, it is difficult to optimize both the thermal conductivity and specific heat capacity of a fluid, and the naturally occurring boundary layer limits the flow near the medium's surface.

Two specific areas of convective heat transfer research address the fluid property and surface flow problems. These two areas include the use of nanofluids and the use of magnetic fields with magnetorhetrological fluids. Both have limited success in enhancing the rate of convective heat transfer.

Nanofluids are conventional fluids with tiny particles therein that may typically be no larger than several nanometers. The particles are usually of high thermal conductivity and are added to the fluid to increase the bulk thermal conductivity of the fluid. In general, the particles are metal or metal oxides, such as for example Cu, CuO and $Al_2O_3$. A significant increase in thermal conductivity has been reported for various volume fractions of particles suspended in different fluids. Experiments performed utilizing nanofluids have shown an increase of convective heat transfer rate when compared to the same fluid without nanoparticles.

The bulk majority of the research in magnetic fields used to enhance heat transfer is focused on the hydrodynamic manipulation of magnetorhetrological fluids (ferrofluids). Much of the numerical and theoretical investigation centers on a disruption of the boundary layer through the use of a constant magnetic field acting on a ferrofluid. In all of these cases the fluid is assumed to remain homogeneous in particle composition. Another area of research utilizes magnetic fields and soft magnetic particles to reduce the disadvantage of inefficient gas-solid two-phase flow. The magnetic particles are attracted to the wall, which has a temperature that is higher than the temperature of the bulk fluid flowing by the wall. The attracted particles are heated above their Curie point by thermal conduction and then are carried away by the flow. By conservation of energy, the temperature of the wall is generally decreased by an amount proportional to the amount of heat carried away, whereas the temperature of the bulk fluid is increased by an amount proportional to the amount of heat carried away.

Neither the use of nanofluids nor constant magnetic fields, described above, optimize the potential for improving convective heat transfer performance.

What is needed is system and method for improving convective heat transfer performance.

BRIEF SUMMARY

It is an object of the present invention to improve convective heat transfer performance by providing combined thermal conductivity characteristics of certain solids with the high specific heat values of appropriate fluids to enhance the overall heat transfer characteristics of a heat exchanger.

In order to achieve at least the above-discussed object, in accordance with one aspect of the present invention, a system for transferring heat away from the surface of a heat exchanger is presented. The system comprises a fluid channel disposed in a heat exchanger unit, containing a slurry as the convective heat transfer medium. The slurry comprises an appropriate fluid with field reactive particles suspended therein. Additionally, field emitters are located along the walls of the fluid channel to manipulate the dispersion of the particles within the slurry. By attracting the field reactive particles directly to the walls of the fluid channel, heat can be effectively transferred to/from the particles with minimal thermal resistance. Releasing the particles into the bulk fluid allows the heat to be transferred to/from the high specific heat fluid very effectively because of the large total surface area of the particles when separated within the bulk fluid. The attracting and releasing the particles from the walls of the fluid channel has the additional advantage of breaking up the boundary layer and allowing fluid from the core bulk flow to come in more direct contact with the wall.

In one exemplary embodiment, the slurry comprises ferromagnetic (or other materials effected by magnetic fields) particles and a liquid used as the convective heat transfer medium. A time-varying magnetic field is produced in a fluid channel of the heat exchanger to cause the ferromagnetic particles to be attracted to the walls of the fluid channel. The field would remain energized long enough to attract the ferromagnetic particles to the walls and also allow the heat to be transferred to/from the ferromagnetic particles. The ferromagnetic particles are highly conductive and therefore are able to quickly conduct heat directly from the wall with their superior thermal conductivity, which may be as much as three orders of magnitude over common heat transfer liquids. The particles are then released back into the fluid and transfer heat into/out of the bulk liquid. With a magnetic field utilized as the particle manipulative motive force, particle removal may be enhanced by: de-energizing the magnetic field that initially attracted the particle to the wall; and then energizing of a magnetic field that is displaced spatially from the field that initially attracted the particle to the wall. Although the particles can be removed from the wall by the hydrodynamic forces of the flowing fluid, the additional use of a magnetic field would help ensure the removal of particles from the solid surface.

In another exemplary embodiment, the slurry comprises particles that are affected by electric fields and a liquid used as the convective heat transfer medium. A time-varying electric field is produced in a fluid channel of the heat exchanger to cause the particles to be attracted to the walls of the fluid channel. The field would remain energized long enough to attract the particles to the walls and also allow the heat to be transferred to/from the particles. The particles are highly conductive and therefore are able to quickly conduct heat directly from the wall with their superior thermal conductivity. The particles are then released back into the fluid and transfer heat into/out of the bulk liquid. With an electric field utilized as the particle manipulative motive force, particle removal may be enhanced by: de-energizing the electric field that initially attracted the particle to the wall; and then energizing an electric field that is displaced spatially from the field that initially attracted the particle to the wall. Further, particle removal may be additionally enhanced by reversing the polarity of the electric field that initially attracted the particle to the wall. Although the particles can be removed from the wall by the hydrodynamic forces of the flowing fluid, the additional use of an electric field would help ensure the removal of particles from the solid surface.

Superior heat transfer occurs because of the large surface area to volume ratio of the particles after they separate from the wall and mix back into the bulk fluid. Another benefit of the attraction and repulsion of the particles from the walls is the breaking up of the boundary layer close to the fluid channel wall. The breaking up of the boundary layer also enhances the convective heat transfer by helping to transport bulk fluid having the average bulk fluid temperature close to the surface of the fluid channel.

The ferromagnetic particle size can vary, for example from millimeter to nanometer sized particles. It is important that the slurry does not remain homogeneous when acted on by a field because the particles need the ability to be individually attracted to the solid surface.

Additional objects advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings which are incorporated in and form a part of the specification, illustrate exemplary embodiments of the present invention and, together with the description, serve to explain the principles of the invention. In the drawings.

DETAILED DESCRIPTION

Figure 1:
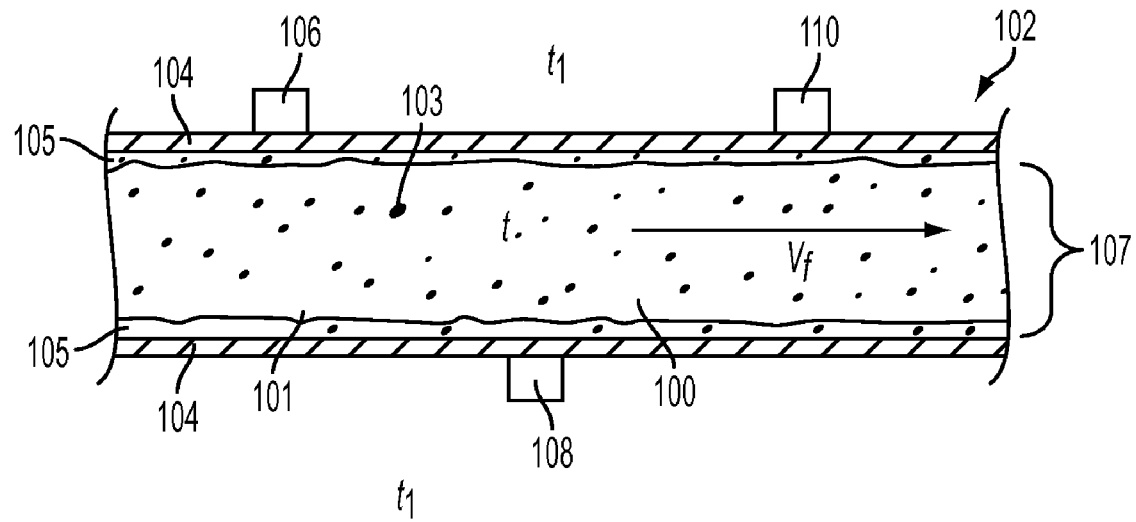
FIG. 1 illustrates a fluid channel containing a slurry in accordance with one embodiment of the present invention.

FIG. 1 illustrates a fluid channel 102, having a slurry 100 flowing therethrough, to be used in accordance with the present invention. Slurry 100 includes fluid 101 and particles 103 therein. Particles 103 may comprise any type of material or combination of materials that has a field-reactive property non-limiting examples of which include an electric and/or a magnetic field reactive property. Particles 103 possess greater thermal conductivity than fluid 101. Additionally, particles 103 may vary in size and shape and further need not be uniform. The size of particles 103 preferably should not be so large as to impede the flow of slurry 100 through fluid channel 102. In an exemplary embodiment, particles 103 are no larger than several nanometers. Further, in the presence of a field, particles 103 are capable of non-homogeneous distribution within fluid 101.

In operation, slurry 100 flows through fluid channel 102 creating a boundary layer 105 adjacent to a wall 104. Accordingly, a bulk of the slurry or bulk slurry 107 is the portion of slurry 100 that is flowing, and flows with an average velocity $V_f$. Wall 104 initially has a temperature $t_1$, whereas the average temperature of bulk slurry 107 is $t_2$. For purposes of simplifying an explanation of an embodiment of the present invention, the case will be discussed wherein $t_1$ is greater than $t_2$, wherein slurry 100 will take heat from wall 104 (e.g., slurry 100 will have a cooling effect on wall 104). One of skill in the art would readily recognize the operation of the present invention in the case of $t_2$ being greater than $t_1$, wherein slurry 100 will give heat to wall 104 (e.g., slurry will have a heating effect on wall 104).

Figure 2:
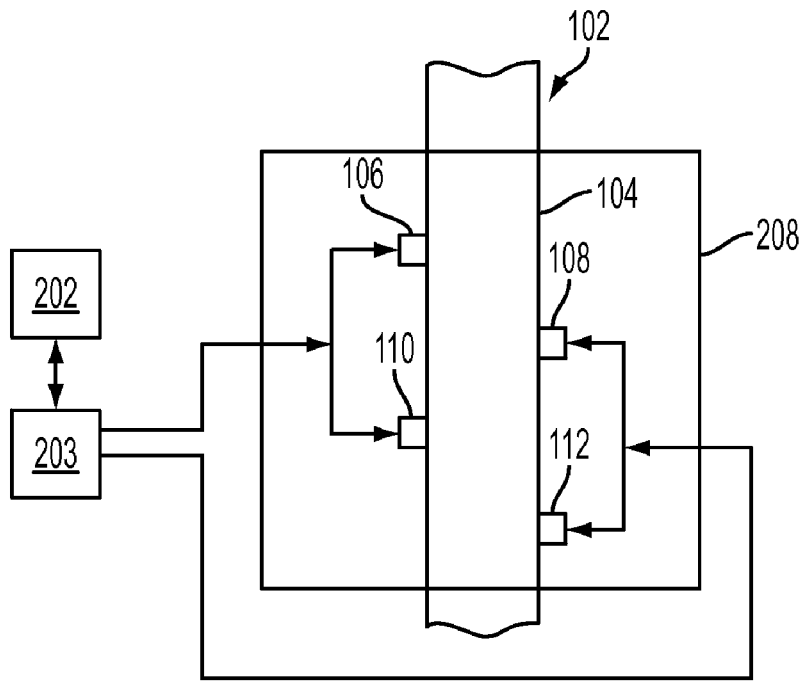
FIG. 2 illustrates a heat transfer unit in accordance with one embodiment of the present invention.

FIG. 2 illustrates a heat transfer unit 208 in accordance with one embodiment of the present invention. As depicted in FIG. 2, fluid channel 102 containing slurry 100, and field emitters 106, 108, 110 and 112 displaced along fluid channel wall 104, are disposed in heat transfer unit 208 that is capable of maintaining a temperature $t_1$ that is greater than the temperature $t_2$ of a bulk of slurry 100. Additionally FIG. 2 depicts a power supply 202 and signal generator 203 that provides a signal to control the activation of field emitters 106, 108, 110 and 112. Convective heat transfer occurs between heat transfer unit 208 and slurry 100, as slurry 100 moves through fluid channel 102.

As slurry 100 moves through fluid channel 102, fields are emitted by emitters 106, 108, 110 and 112. The fields attract particles 103 to the walls of fluid channel 102 in the proximity of emitters 106, 108, 110 and 112. The presence of particles 103 adjacent to or in close proximity to fluid channel wall 104 disrupts the boundary layer and enables increased convective heat transfer to slurry 100 across fluid channel wall 104 than would otherwise be possible in the absence of particles 103. Particles 103 are then released from the close proximity to fluid channel wall 104 and disperse throughout fluid 101 to transfer the recently acquired heat to fluid 101. The transferred heat is then carried away from a portion of heat transfer unit 208 as slurry 100 moves through fluid channel 104.

Figure 3A:
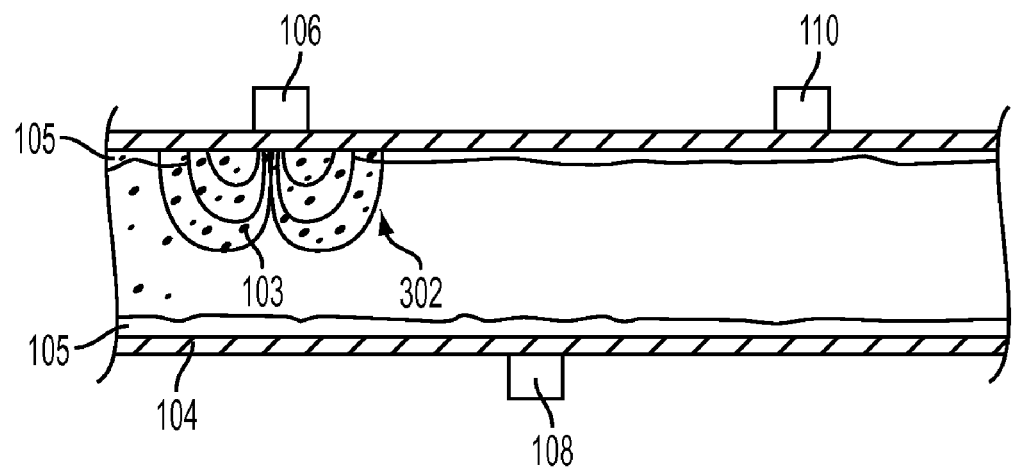
FIG. 3a illustrates a field created by an emitter in the fluid channel of FIG. 1.

Returning to FIG. 1, field emitters 106, 108 and 110, are displaced along the sides of fluid channel wall 104. Each field emitter can emit a field to affect particles 103. When field 302 is emitted, as depicted in FIG. 3A, particles 103 are attracted to fluid channel wall 104 in the proximity of emitter 106. By attracting particles 103 directly to the surface of fluid channel wall 104, thermal resistance of slurry 100, caused by the distance between particles 103 and fluid channel wall 104, is reduced and more effective heat transfer to particles 103 is achieved. Because particles 103 have greater thermal conductivity than fluid 101, total heat transfer achieved is greater than would otherwise be possible in the absence of particles 103.

Figure 3B:
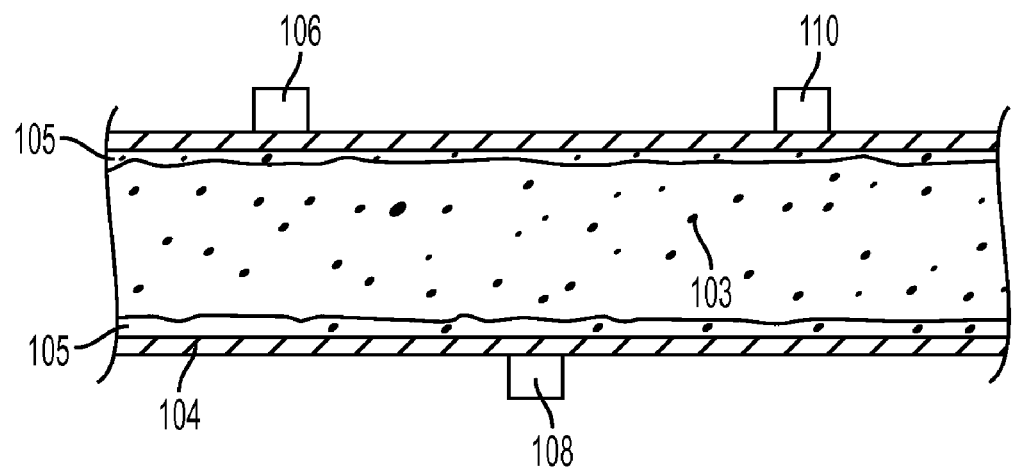
FIG. 3b illustrates the breakup of boundary layer in the fluid channel of FIG. 1.

FIG. 3B illustrates the separation of particles 103 from fluid channel wall 104 as emitter 106 stops emitting field 302. When emitter 106 stops emitting, particles 103 are released from fluid channel wall 104 and disperse within fluid 101. When particles 103 disperse within fluid 101, heat absorbed by particles 103 while adjacent to fluid channel wall 104 is transferred to fluid 101 and carried away in the direction of $V_f$. Additionally, the release of particles 103 from fluid channel wall 104 further enhances heat transfer by breaking up boundary layer 105 adjacent to fluid channel wall 104, allowing more of bulk slurry 107 having temperature $t_2$ to come in direct contact with fluid channel wall 104.

Returning to FIG. 2, in an exemplary embodiment of the present invention, signal generator 203 alternately activates field emitter parts 106 and 110 and then 108 and 112. In this way, after particles 103 are released from one portion of fluid channel wall 104 in the proximity of one of emitters 106 and 110, they are subsequently attracted to another portion of fluid channel wall 104 in the proximity of another one of emitters 108 and 112 spatially displaced down stream along fluid channel wall 104. Accordingly, particles 103 absorb heat while attached to fluid channel wall 104, then transfer that heat to fluid 101 as they are released from a portion of fluid channel wall 104 and disperse within fluid 101. More heat is then absorbed as particles 103 are attracted to another portion of fluid channel wall 104 as slurry 100 flows down stream through fluid channel 102 and another emitter emits a field 302 attracting particles 103 to a portion of fluid channel wall 104.

A working embodiment of a convective heat transfer system will now be described in detail with reference to FIGS. 4-7D.

Figure 4:
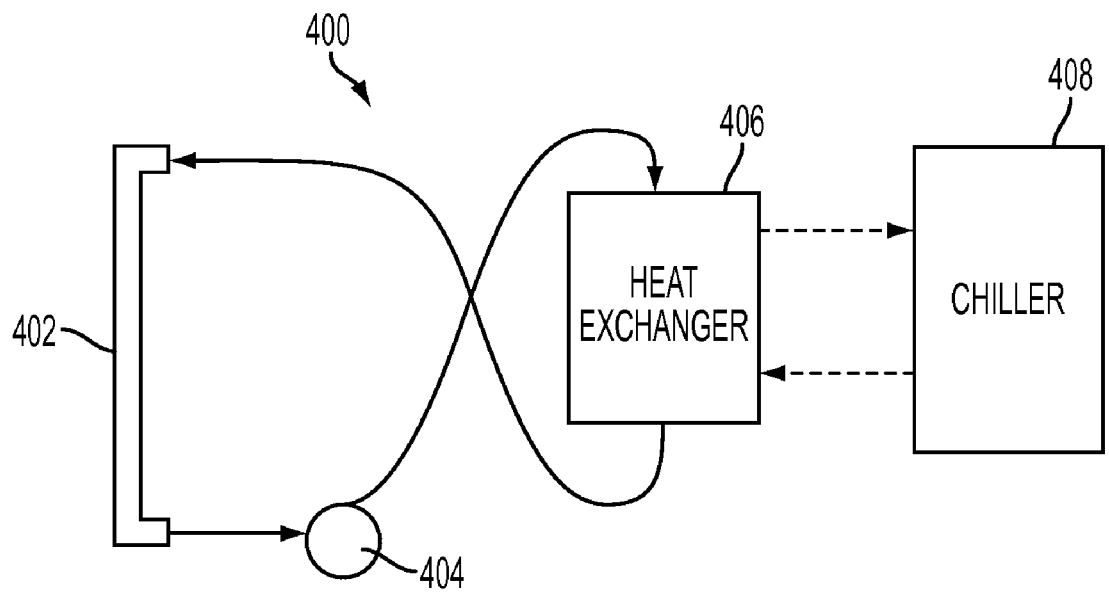
FIG. 4 illustrates a functional diagram of an apparatus that is operable to provide a consistent constant heat flux, a consistent constant temperature heat sink and a constant slurry flow rate.

FIG. 4 illustrates a functional diagram of an apparatus 400 that is operable to provide a consistent constant heat flux, a consistent constant temperature heat sink and a constant slurry flow rate. Apparatus 400 is further operable to provide an accurate comparison between the maximum temperature of the constant flux heat source during a first state of operation wherein there is no applied magnetic field and during a second state of operation wherein there is an applied alternating magnetic field. Apparatus 400 is additionally operable to provide an accurate comparison between the increase in the amount of heat flux between the first state of operation and the second state of operation, when the maximum temperature of the heated tube is kept constant.

A slurry is heated in tubing 402, exits tubing 402 and enters a pump 404. After exiting pump 404, the slurry enters a heat exchanger 406. Heat is removed from the slurry, while in heat exchanger 406, by using chilled water provided by a recirculating chiller 408.

Figure 5:
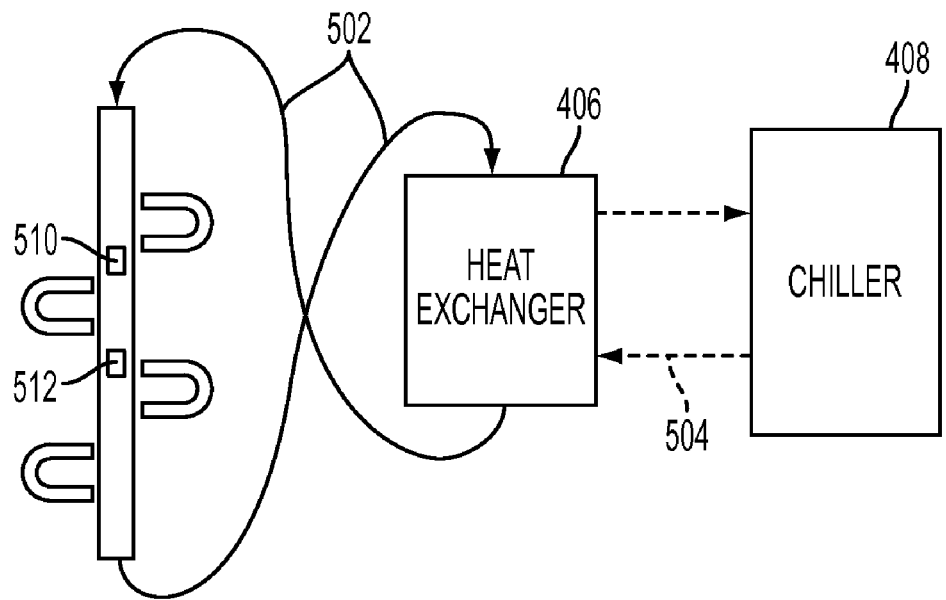
FIG. 5 is a more detailed illustration of apparatus of FIG. 4.

FIG. 5 is a more detailed illustration of apparatus 400. The slurry is contained within the tubes 502 and is cooled by chilled water provided by tube 504 from recirculating chiller 408. After being cooled in heat exchanger 406 the slurry flows to inlet 506 of vertically mounted tubing 508. A vertical orientation, with flow from top to bottom, was utilized for both tubing 508 and heat exchanger 406 to minimize particle-settling effects of gravity. In a working embodiment, a pumping system was utilized that included a variable speed two head rotoflex pump to minimize problems associated with particle-laden flows.

Figure 6:
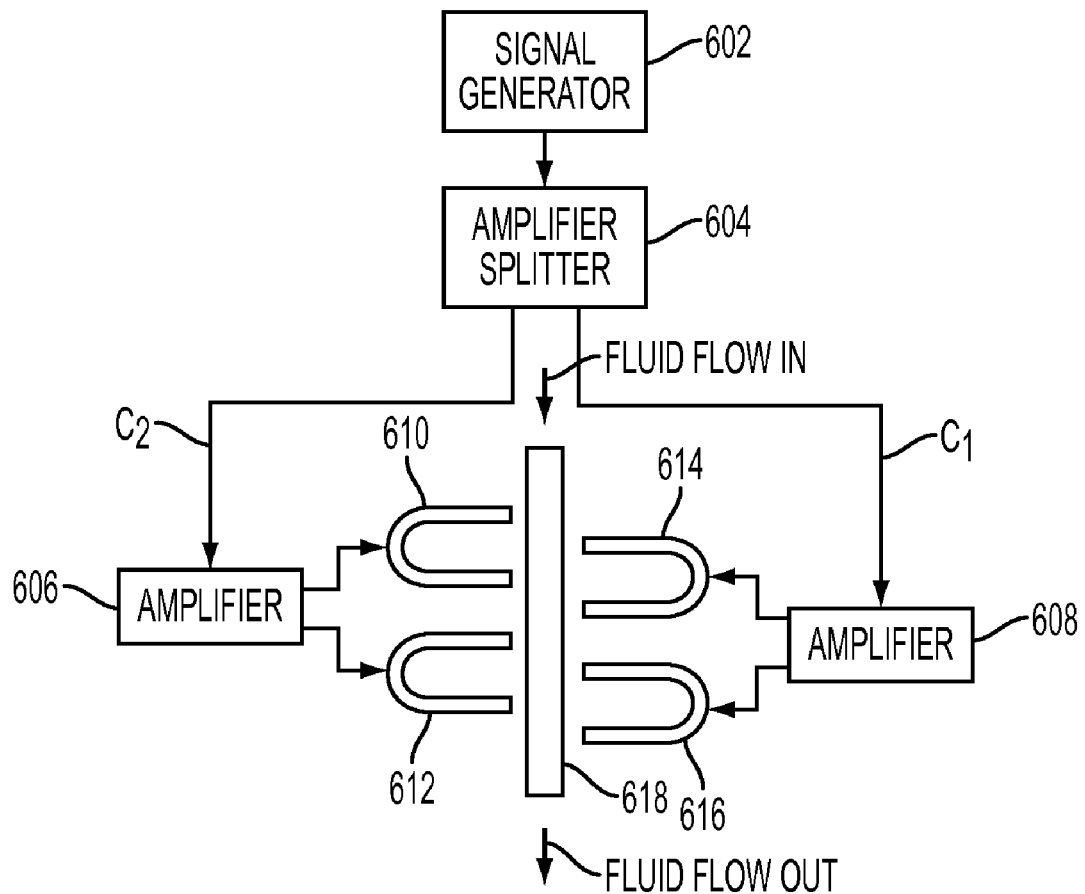
FIG. 6 is a functional block diagram of the control and energizing elements for electromagnets used as field emitters in the embodiment of FIG. 5.
Figure 8:
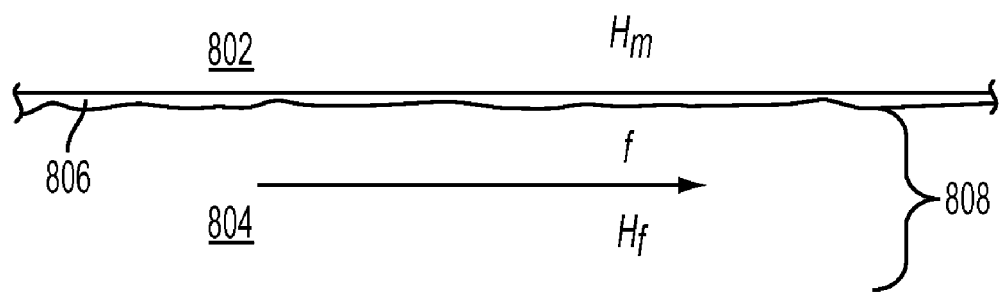
FIG. 8 illustrates a convective heat transfer system.

The electrical components of the system of FIG. 5 may be grouped into three general areas: electromagnet control, heater control and instrumentation. The functional block diagram in FIG. 6 shows the control and energizing elements for electromagnets used as field emitters in the embodiment of FIG. 5. A signal, for example a square-wave signal, is initially generated in a signal generator 602, which allows changing of frequency of the wave. The signal is inputted into an amplifier/splitter 604, which amplifies and splits the signal into two channels. Channel $C_1$ is inverted to be 180 degrees out of phase with channel $C_2$. Each channel is fed to a separate respective power amplifiers 606 and 608. Each power amplifier 606 and 608 powers a pair of U-shaped electromagnets 610 and 612, and 614 and 616, respectively, mounted on each side of tubing 618. Electromagnets 610, 612, 614 and 616 create magnetic field lines oriented generally perpendicular to the wall of tubing 618. This orientation causes the particles to be attracted to and to agglomerate near the end of the electromagnet in a direction that is generally perpendicular to the surface of wall 618 and then to fan out along the lines of magnetic flux.

Returning to FIG. 5, in an exemplary operation, the heat flux was maintained at a constant value by two heater elements 510 and 512 placed approximately 40% and 60% down the length of vertically mounted tubing 508. The invention is not limited to two heaters elements, wherein any number of heating elements may be used. Further, the invention is not limited to the particular placement of the heater elements. Heater elements 510 and 512, in one embodiment, may be connected in parallel to a power amplifier, which maintains a constant voltage and current. A plurality of heat detecting devices and instrumentation were used to determine temperature.

FIGS. 7A-7D are exploded views of a portion of tubing 618 and illustrate the heat transfer process in accordance with one embodiment of the present invention. In FIGS. 7A-7D, $H_1(t)$ represents the temperature of the medium outside tubing 618, whereas $H_2(t)$ represents the average temperature within tubing 618.

Figure 7A:
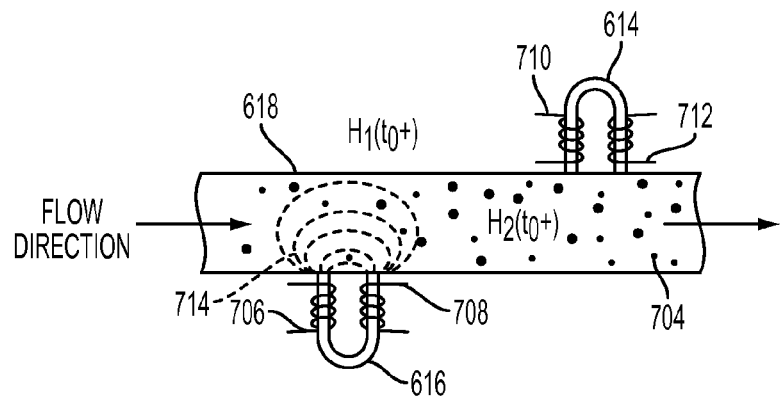
FIGS. 7A-7D are exploded views of a portion of tubing 618 and illustrate the heat transfer process in accordance with one embodiment of the present invention.

FIG. 7A illustrates tubing 618 at time $t=t_0^+$, where $H_1(t_0^+) \gg H_2(t_0^+)$. In the figure, coiled wires 706 and 708 of electromagnet 616 are provided with a signal from amplifier/splitter 604 via amplifier 608 to energize the core of electromagnet 616 thereby generating magnetic field lines 714 (and wherein at time t=0 the magnetic field lines are not present). As illustrated in the figure, magnetic field lines 714 pass through the wall of tubing 618 and into the slurry 702.

Figure 7B:
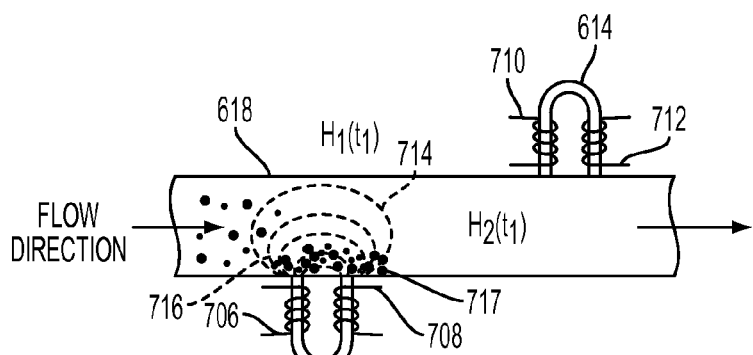

FIG. 7B illustrates tubing 618 at time $t=t_1$, wherein magnetic field lines 714 attract ferromagnetic particles 704 into areas 716 and 717. At this point in time, the rate of heat transfer is increased near areas 716 and 717 as a result of the heat transfer properties of ferromagnetic particles 704. Accordingly, heat is transferred from outside of tubing 618 to slurry 702. As such the overall temperature of the area outside tubing 618 decreases, whereas the overall average temperature of slurry 702 increases, wherein where $H_1(t_1) > H_2(t_1)$.

Figure 7C:
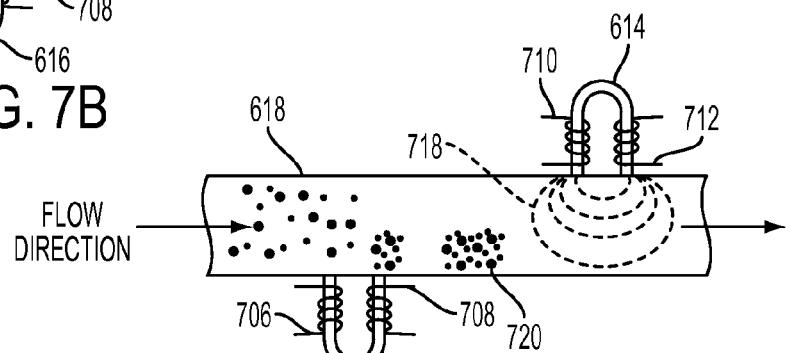

FIG. 7C illustrates tubing 618 at time $t=t_2$, wherein coiled wires 706 and 708 of electromagnet 616 are no longer provided with a signal from amplifier/splitter 604 via amplifier 608 to energize the core of electromagnet 616 but coiled wires 710 and 712 of electromagnet 614 are provided with a signal from amplifier/splitter 604 via amplifier 606 to energize the core of electromagnet 614. Accordingly, magnetic field lines 714 are no longer present but magnetic field lines 718 are generated. As illustrated in the figure, magnetic field lines 718 pass through the wall of tubing 618 and into the slurry 702. Particles 720 leave areas 716 and 717 and begin to disperse into slurry 702. At this point, the heat collected by ferromagnetic particles 704 is transferred into the liquid of slurry 702 such that the temperature of ferromagnetic particles 704 decreases and the temperature of the liquid of slurry 702 increases.

Figure 7D:
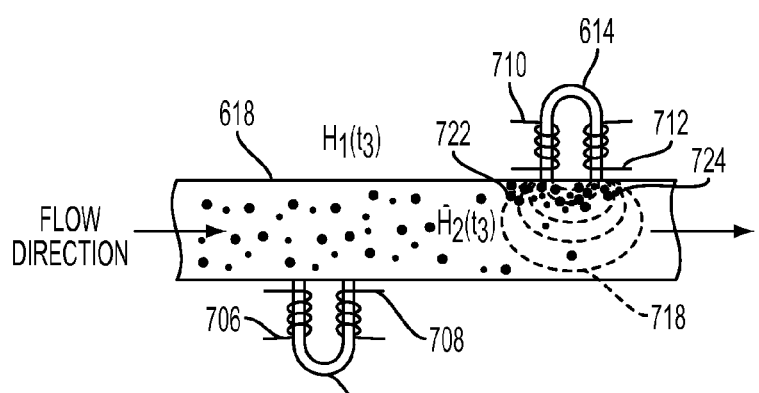

FIG. 7D illustrates tubing 618 at time $t=t_3$, wherein magnetic field lines 718 attract ferromagnetic particles 704 into areas 722 and 724. At this point, the rate of heat flux transfer is again increased as a result of the heat transfer properties of the now cooled ferromagnetic particles 704. Accordingly, more heat is transferred from outside of tubing 618 to slurry 702. As such the overall temperature of the area outside tubing 618 decreases further, whereas the overall average temperature of slurry 702 increases further, wherein where $H_1(t_3) < H_2(t_3)$.

Several data collection runs were performed with apparatus 400 with experimental parameters varied. In some exemplary data collection runs, the slurry comprised oil with iron fillings dispersed therein. The parameters that were varied included concentration of iron fillings to oil, frequency of electromagnet power and current used to energize electromagnets 610, 612, 614 and 616. The results obtained with a constant heat input showed a dramatic decrease in the temperature of the surface of tubing 508 at the midpoint between the inlet and the outlet (the maximum pipe temperature). During these experimental runs, recirculating chiller 408 temperature maintained a temperature of 20° C. and the power inputted into the heaters was 65 W. For one of the more extreme cases, the maximum temperature of tubing 508 (at the tubing midpoint) was measured at 57.2° C., whereas with electromagnets 610, 612, 614 and 618 being deenergized and energized with a time varying square wave, the temperature measured was 42.5° C. Null checks were performed with pure mineral oil to ensure that the instrumentation was not reading incorrectly or the heaters operating improperly because of the fluctuating magnetic fields.

To determine the magnitude of convective heat transfer increase, an experiment was run to determine the amount of heat that could be added and still maintain the same temperature as the full power case with electromagnets 610, 612, 614 and 616 cycling. The maximum increase in heat transfer rate that was obtained with the experimental setup was 80%.

In another exemplary embodiment, an electric field may be used instead of a magnetic field to attract and repel the particles to/from the solid surface. With an electric field the highly thermal conductive particle may comprise, for example, an ionic material or some material that can be manipulated by an electric field. With an electric field utilized as the particle manipulative motive force, particle removal may be enhanced by: de-energizing the electric field that initially attracted the particle to the wall; and then energizing of an electric field that is displaced spatially from the field that initially attracted the particle to the wall. Further, particle removal may be additionally enhanced by reversing the polarity of the electric field that initially attracted the particle to the wall. Although the particles can be removed from the wall by the hydrodynamic forces of the flowing fluid, the use of a separate electric field would help ensure the removal of particles from the solid surface.

In another embodiment, the orientation of the line of magnetic flux used to attract the ferromagnetic particles to the wall is varied in any direction, for example parallel to the wall of tubing 508, such that the magnetic flux lines attract the ferromagnetic particles to the surface of tubing 508.

A system combines the thermal conductivity characteristics of certain solids with the high specific heat values of appropriate fluids to enhance the overall heat transfer characteristics of a heat exchanger. The system comprises a fluid channel disposed in a heat exchanger unit with a slurry as the convective heat transfer medium. The slurry comprises an appropriate fluid with field reactive particles suspended therein. Field emitters are located along the walls of the fluid channel whereby the distribution of particles within the slurry is manipulated to achieve enhanced heat transfer characteristics.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A convective heat transfer system to be used with a fluid having particles therein, said system comprising:
   a fluid channel having a wall and being capable of transferring the fluid and the particles in the fluid; and
   means for emitting a time-varying field into said fluid channel such that, when the fluid is in the channel, the time varying field affects a portion of the particles to change a rate of heat transfer between said wall of said fluid channel and the fluid, such that an increase in the time varying field attracts the portion of the particles to said wall sufficiently to transfer heat from said wall to the portion of the particles and a decrease in the time varying field releases the portion of the particles away from said wall thereby breaking up a boundary layer in the fluid adjacent to said wall and transporting heat away from said wall.

2. The system of claim 1, wherein said means for emitting a time-varying field operates such that, when the fluid is in the channel, the time varying field affects the portion of the particles thereby creating a non-homogeneous distribution of particles.

3. The system of claim 1, wherein said means for emitting a time varying magnetic field includes a first field emitter.

4. The system of claim 3, said means for emitting a time varying field further includes a second field emitter spaced apart from the the field emitter in the downstream flow direction of the channel, the second field emitter arranged to emit a time-varying field into said fluid channel such that an increase in the time-varying field of the second field emitter attracts the particles released from the wall by the decrease in field of the first field emitter.

5. The system of claim 1, further comprising:
   the fluid in said fluid channel; and
   particles in said fluid.

6. The system of claim 5, wherein said particles comprise a material reactive to a magnetic field.

7. The system of claim 5, wherein said particles comprise a material reactive to an electric field.

8. The system of claim 5, wherein the fluid is a slurry.

9. The system of claim 1, further comprising:
   a chiller system for cooling the fluid, the chiller arranged to transfer the cooled fluid into the fluid channel.

10. A convective heat transfer method comprising:
    flowing a fluid having magnetic particles therein into a fluid channel having a wall; and
    emitting a time-varying magnetic field from a field emitter into the fluid channel thereby affecting a portion of the particles to change a rate of heat transfer between the wall of the fluid channel and the fluid,
    wherein said emitting a time-varying magnetic field includes increasing the time varying field, thereby attracting the portion of the particles to said wall sufficiently to transfer heat from said wall to the portion of the particles, and subsequently decreasing the time varying field, thereby releasing the portion of the particles away from said wall thereby breaking up a boundary layer in the fluid adjacent to said wall and transporting heat away from said wall.

11. The method of claim 10, wherein said emitting a time-varying magnetic field affects the portion of the particles thereby creating a non-homogeneous distribution of particles.

12. The system of claim 10, further comprising:
    receiving said fluid having magnetic particles therein from a chiller before said flowing the fluid having magnetic particles therein into the fluid channel.

* * * * *